(12) United States Patent
Nishi

(10) Patent No.: US 11,313,024 B2
(45) Date of Patent: Apr. 26, 2022

(54) VAPOR DEPOSITION METAL MASK, VAPOR DEPOSITION METAL MASK PRODUCTION METHOD, AND DISPLAY DEVICE PRODUCTION METHOD

(71) Applicant: TOPPAN PRINTING CO., LTD., Tokyo (JP)

(72) Inventor: Takehiro Nishi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 226 days.

(21) Appl. No.: 16/248,643

(22) Filed: Jan. 15, 2019

(65) Prior Publication Data

US 2019/0144989 A1 May 16, 2019

Related U.S. Application Data

(63) Continuation of application No. PCT/JP2017/027814, filed on Aug. 1, 2017.

(30) Foreign Application Priority Data

Aug. 5, 2016 (JP) .............................. JP2016-155099

(51) Int. Cl.
*C23C 14/04* (2006.01)
*C23F 1/02* (2006.01)

(52) U.S. Cl.
CPC .............. *C23C 14/042* (2013.01); *C23F 1/02* (2013.01)

(58) Field of Classification Search
CPC ................................................... C23C 14/042
See application file for complete search history.

(56) References Cited

U.S. PATENT DOCUMENTS

2011/0027461 A1* 2/2011 Matsu ................... C23C 14/042
427/67
2011/0293819 A1* 12/2011 Lee ..................... H01L 51/0025
427/66

(Continued)

FOREIGN PATENT DOCUMENTS

CN 202534699 U 11/2012
JP 2010174305 * 8/2010 ............. C23C 14/24

(Continued)

OTHER PUBLICATIONS

English translation JP 2010174305, Aug. 2010, Okamoto (Year: 2010).*

(Continued)

*Primary Examiner* — Keath T Chen
(74) *Attorney, Agent, or Firm* — Squire Patton Boggs (US) LLP

(57) ABSTRACT

A vapor deposition metal mask includes a mask region including a plurality of mask holes. A connection portion of each mask hole located at a position other than the center of the mask region has a shape protruding inward of the mask hole along the entire circumference of the mask hole and is configured by a first section, which is a section closer to the center of the mask region and a second section, which is a section closer to one of the ends of the mask region. The distance between the first section and the reverse surface of the mask region is a first step height. The first step height in the end region is smaller than the first step height in the central region.

18 Claims, 6 Drawing Sheets

(56) References Cited

U.S. PATENT DOCUMENTS

| | | | |
|---|---|---|---|
| 2012/0060756 A1* | 3/2012 | Ookawara | C23C 14/042 |
| | | | 118/504 |
| 2013/0133573 A1* | 5/2013 | Joo | C23C 14/042 |
| | | | 118/504 |
| 2013/0192521 A1 | 8/2013 | Chu et al. | |
| 2014/0099740 A1* | 4/2014 | Lee | C23C 14/042 |
| | | | 438/22 |
| 2018/0287063 A1* | 10/2018 | Chang | C23C 16/042 |

FOREIGN PATENT DOCUMENTS

| | | |
|---|---|---|
| JP | 2014-148744 A | 8/2014 |
| TW | 201331393 A | 8/2013 |

OTHER PUBLICATIONS

Chinese First Office Action for Chinese Application No. 201780047940.8, dated May 18, 2020, with English translation, 12 pages.
Chinese Office Action for Chinese Application No. 201780047940.8, dated Jan. 27, 2022, with English translation, 35 pages.
Xuzhou, "Thin Film Optics and Thin Film Technology", China University of Mining and Technology Press, Nov. 30, 2009, pp. 107-108.

* cited by examiner

VAPOR DEPOSITION METAL MASK, VAPOR DEPOSITION METAL MASK PRODUCTION METHOD, AND DISPLAY DEVICE PRODUCTION METHOD

CROSS-REFERENCE

This application is a continuation of International Application No. PCT 2017/027814, filed on Aug. 1, 2017, which claims priority to Japanese Patent Application No. 2016-155099, filed on Aug. 5, 2016. All contents of the aforementioned applications, including the specification and the drawings, are incorporated herein by reference.

BACKGROUND

The present disclosure relates to a vapor deposition metal mask, a method for manufacturing a vapor deposition metal mask, and a method for manufacturing a display.

A vapor deposition metal mask includes an obverse surface and a reverse surface. The reverse surface contacts a vapor deposition target such as a substrate. The obverse surface is the mask face on the opposite side from the reverse surface. Mask holes extending through the obverse surface and the reverse surface each include large holes and small holes. The large hole includes a large opening, which is an opening in the obverse surface. The small hole includes a small opening, which is an opening in the reverse surface. The inner circumferential surface that defines each mask hole protrudes inward of the mask hole at a connection portion between the large hole and the small hole. In film formation using the vapor deposition metal mask, vapor deposition material passes through the mask holes from the large openings to the small openings and is deposited on the vapor deposition target. This forms vapor deposition patterns that conform to the position and the shape of the small openings on the vapor deposition target (for example, see Japanese Laid-Open Patent Publication No. 2014-148744).

A vapor deposition apparatus employs one vapor deposition source for multiple mask holes. For example, a vapor deposition apparatus includes one vapor deposition source, and a vapor deposition metal mask is placed in such a manner that the mask holes located at the center of the multiple mask holes face the vapor deposition source. Alternatively, a vapor deposition apparatus includes multiple vapor deposition sources, and a vapor deposition metal mask is placed in such a manner that, among different groups of the mask holes included in one mask region, the mask holes located at the center of each group face the corresponding one of the vapor deposition sources. Alternatively, a vapor deposition apparatus includes multiple vapor deposition sources, and a vapor deposition metal mask is placed in such a manner that the mask holes located at the center of the multiple mask holes included in one mask region face one of the vapor deposition sources, and the mask holes located at the center of the multiple mask holes included in another mask region face another vapor deposition source.

In the above configuration, the direction from one vapor deposition source toward the mask holes located at the center differs from the direction from one vapor deposition source to other mask holes. Furthermore, the amount of the vapor deposition material discharged from the vapor deposition source is generally the greatest at the position opposite to the vapor deposition source and varies within the range of the above-described directions. Thus, the amount of the vapor deposition material that passes through the mask holes varies in the vapor deposition metal mask. As a result, the film thickness of the vapor deposition pattern formed in each mask hole varies in the vapor deposition metal mask.

SUMMARY

It is an objective of the present disclosure to provide a vapor deposition metal mask that improves the uniformity of the film thickness of vapor deposition patterns formed in mask holes within the vapor deposition metal mask, a method for manufacturing the vapor deposition metal mask, and a method for manufacturing a display.

To achieve the foregoing objective, a vapor deposition metal mask that includes a mask region including a plurality of mask holes is provided. The mask region includes a central region and an end region. The central region includes a center of the mask region and some of the mask holes for facing a vapor deposition source. The end region is located closer to one of ends of the mask region than the central region and includes some of the mask holes that are different from the mask holes included in the central region. The mask region includes an obverse surface including a large opening of each mask hole and a reverse surface including a small opening of each mask hole. Each mask hole includes a large hole, which includes the large opening and narrows toward the small opening, a small hole, which includes the small opening and narrows toward the large opening, and a connection portion at which the large hole is connected to the small hole. Each connection portion located at a position other than the center of the mask region has a shape protruding inward of the mask hole along the entire circumference of the mask hole and is configured by a first section, which is a section closer to the center of the mask region and a second section, which is a section closer to one of the ends of the mask region. The distance between the first section and the reverse surface is a first step height. The first step height in the end region is smaller than the first step height in the central region.

To achieve the foregoing objective, a method for manufacturing a vapor deposition metal mask including a mask region including a plurality of mask holes is provided. The mask region includes a central region and an end region. The central region includes a center of the mask region and some of the mask holes for facing a vapor deposition source. The end region is located closer to one of ends of the mask region than the central region and includes some of the mask holes that are different from the mask holes included in the central region. The method includes: forming a small hole specific to each mask hole from the reverse surface toward the obverse surface of the metal mask substrate, the small hole including a small opening open in the reverse surface and narrowing toward the obverse surface; and forming a large hole specific to each mask hole from the obverse surface toward the reverse surface of the metal mask substrate, the large hole including a large opening open in the obverse surface and narrowing toward the reverse surface, and forming the large hole thus forming a connection portion at which the small hole is connected to the large hole. Forming the connection portion includes forming, at a position other than the center of the mask region, each connection portion that has a shape protruding inward of the mask hole along the entire circumference of the mask hole and is configured by a first section, which is a section closer to the center of the mask region, and a second section, which is a section closer to one of the ends of the mask region. The distance between the first section and the reverse surface is a first step height. The first step height of the connection portion formed in the end region is smaller than the first step height of the connection portion formed in the central region.

To achieve the foregoing objective, a method for manufacturing a display is provided that includes forming a vapor deposition metal mask including a mask region including a plurality of mask holes. The mask region includes a central region and an end region. The central region includes a center of the mask region and some of the mask holes for facing a vapor deposition source. The end region is located closer to one of ends of the mask region than the central region and includes some of the mask holes that are different from the mask holes included in the central region. The method further includes forming a vapor deposition pattern in each mask hole on a vapor deposition target using the vapor deposition metal mask. Forming the vapor deposition metal mask includes: forming a small hole specific to each mask hole from the reverse surface toward the obverse surface of the metal mask substrate, the small hole including a small opening open in the reverse surface and narrowing toward the obverse surface; and forming a large hole specific to each mask hole from the obverse surface toward the reverse surface of the metal mask substrate, the large hole including a large opening open in the obverse surface and narrowing toward the reverse surface, and forming the large hole thus forming a connection portion at which the small hole is connected to the large hole. Forming the connection portion includes forming, at a position other than the center of the mask region, each connection portion that has a shape protruding inward of the mask hole along the entire circumference of the mask hole and is configured by a first section, which is a section closer to the center of the mask region, and a second section, which is a section closer to one of the ends of the mask region. The distance between the first section and the reverse surface is a first step height. The first step height of the connection portion formed in the end region is smaller than the first step height of the connection portion formed in the central region.

With each of the above-described configurations, in the vapor deposition metal mask, regardless of whether one vapor deposition source faces one mask region, or a different vapor deposition source faces each of the multiple mask regions, the first section of the mask holes included in the central region limits passing of the vapor deposition material to a greater extent than the first section of the mask holes included in each end region. This improves the uniformity of the film thickness of the vapor deposition pattern formed in each mask hole within the vapor deposition metal mask.

The vapor deposition metal mask that solves the above objective includes one mask region configured by all the mask holes of the vapor deposition metal mask. The mask region includes the central region and the end region. The end region includes one of the ends of the mask region and some of the mask holes. The central region is located closer to the center of the mask region than the end region and includes some of the mask holes that are different from the mask holes included in the end region and are for facing the vapor deposition source. The mask region includes the obverse surface, which includes the large openings of the mask holes, and the reverse surface, which includes the small openings of the mask holes. Each mask hole includes the large hole, which includes the large opening and narrows toward the small opening, the small hole, which includes the small opening and narrows toward the large opening, and the connection portion at which the large hole is connected to the small hole. The connection portion located at positions other than the center of the mask region protrudes inward of the mask hole along the entire circumference of the mask hole and includes the first section closer to the center of the mask region and the second section closer to one of the ends of the mask region. The distance between the first section and the reverse surface is the first step height, and the first step height in the end region is smaller than the first step height in the central region.

With the above-described configuration, regardless of whether one vapor deposition source faces the mask region or multiple vapor deposition sources face the mask region, the first step height in the end region, which includes one of the ends of the mask region, is smaller than the step height in the central region. Thus, the first section of the mask holes included in the central region limits the passing of the vapor deposition material to a greater extent than the first section of the mask holes included in the end region. This improves the uniformity of the film thickness of the vapor deposition pattern formed in each mask hole within the vapor deposition metal mask.

In the above-described vapor deposition metal mask, the distance between the second section and the reverse surface is a second step height. In each mask hole, the second step height may be greater than or equal to the first step height.

With the above-described configuration, even if the first step height is decreased, the strength of the vapor deposition metal mask is prevented from being decreased since the second step height is greater than or equal to the first step height.

With the above-described vapor deposition metal mask, the inner circumferential surface of the large hole in the cross section orthogonal to the obverse surface may have an arcuate shape, and the inner circumferential surface of the small hole in the above-described cross section may have an arcuate shape. In the above-described cross section, among normals to the obverse surface, the normal passing through the center of the large opening is a large hole normal, and the normal passing through the center of the small opening is a small hole normal. The large hole normal that belongs to each mask hole is located at the position that is the same as the small hole normal that belongs to the same mask hole, or is located at the position closer to the center of the mask region than the small hole normal that belongs to the same mask hole. The distance between the large hole normal and the small hole normal that belong to the same mask hole is a normal-to-normal distance. The normal-to-normal distance in the end region may be greater than the normal-to-normal distance in the central region.

With the above-described configuration, the first step height in the end region is set to be smaller than the first step height in the central region by only changing the position of each large hole with respect to the corresponding small hole. This facilitates designing of the vapor deposition metal mask.

With the above-described vapor deposition metal mask, the vapor deposition metal mask includes multiple end regions. The end regions are arranged in a direction in which the mask holes are arranged. The greater the distance between the end region and the central region, the greater may be the normal-to-normal distance in the end region.

With the above-described vapor deposition metal mask, the vapor deposition metal mask includes multiple end regions. The end regions are arranged in a direction in which the mask holes are arranged. The greater the distance between the end region and the central region, the smaller may be the first step height in the end region.

With each of the above-described configurations, the smaller the distance between the end region and the central region, the more the first section of the mask holes included in the end region limits passing of the vapor deposition material than the mask holes included in the end region located closer to one of the ends of the mask region than that end region. This improves the uniformity of the film thickness of the vapor deposition pattern formed in each mask hole within the vapor deposition metal mask.

With the above-described vapor deposition metal mask, the distance between the second section and the reverse surface is the second step height. The greater the distance between the end region and the central region, the greater may be the second step height in the end region.

With the above-described configuration, since the second step height is increased as the distance between the end region and the central region is increased, the second step height compensates for the decrease in the strength of each end region caused by the decrease in the first step height.

With the above-described vapor deposition metal mask, the end region may be the region including one of the ends of the mask region.

With the above-described configuration, the advantage of decreasing the first step height in the end regions to be smaller than the first step height in central region is easily obtained since the end regions include the ends to which the vapor deposition material discharged from vapor deposition source is the most difficult to reach within one mask region.

DESCRIPTION OF EXEMPLARY EMBODIMENTS

A vapor deposition metal mask, a method for manufacturing a vapor deposition metal mask, and a method for manufacturing a display according to one embodiment will be described with reference to FIGS. 1 to 13. The structure of the vapor deposition metal mask, the operation of the vapor deposition metal mask, the method for manufacturing the vapor deposition metal mask, the method for manufacturing a display, and examples will be described in order.

[Structure of Vapor Deposition Metal Mask]

Figure 1:
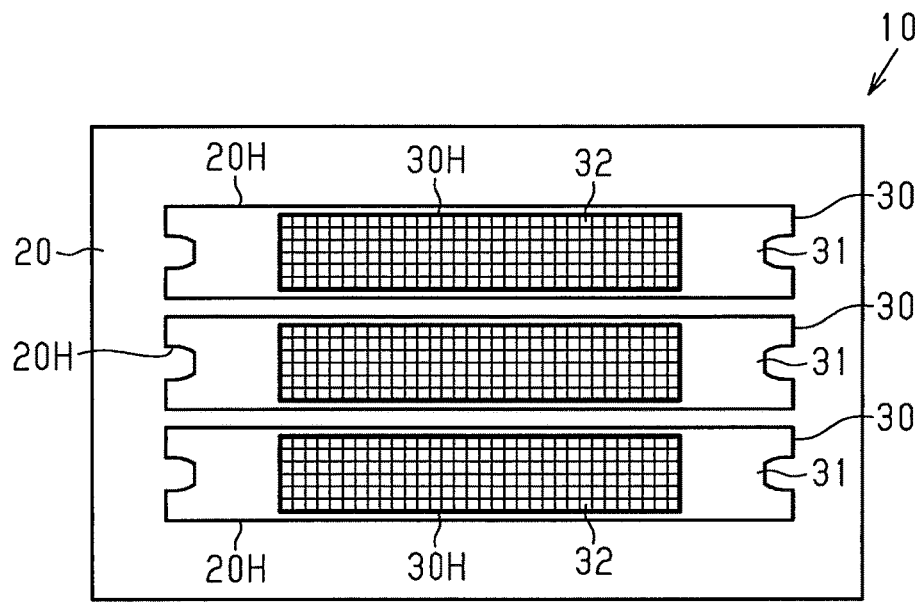
FIG. 1 is a plan view showing the planar structure of a vapor deposition metal mask according to one embodiment.

As shown in FIG. 1, a mask apparatus 10 includes a main frame 20 and vapor deposition metal masks 30. The main frame 20 is a frame-shaped plate supporting the vapor deposition metal masks 30 and is attached to a vapor deposition apparatus for vapor deposition. The main frame 20 includes main frame holes 20H each of which extends over substantially the entire section to which the corresponding vapor deposition metal mask 30 is attached. The main frame holes 20H extend through the main frame 20.

Each vapor deposition metal mask 30 includes a sub-frame 31 and a mask member 32 made of, for example, metal. The sub-frame 31 is a frame-shaped plate supporting the corresponding mask member 32 and is attached to the main frame 20. Each sub-frame 31 includes a sub-frame hole 30H that extends over substantially the entire section to which the corresponding mask member 32 is attached. Each sub-frame hole 30H extends through the sub-frame 31. Each mask member 32 is fixed to the rim defining the corresponding sub-frame hole 30H by welding or adhesion. An example of the planar structure of the mask member 32 will be described with reference to FIG. 2. The vapor deposition metal mask 30 does not necessarily have to have the mask member 32 fixed to the sub-frame 31. The vapor deposition metal mask 30 may include a mask portion corresponding to the mask member 32 and a peripheral portion surrounding the mask portion. In this case, the mask portion and the peripheral portion may be integrally made of a single metal plate.

Figure 2:
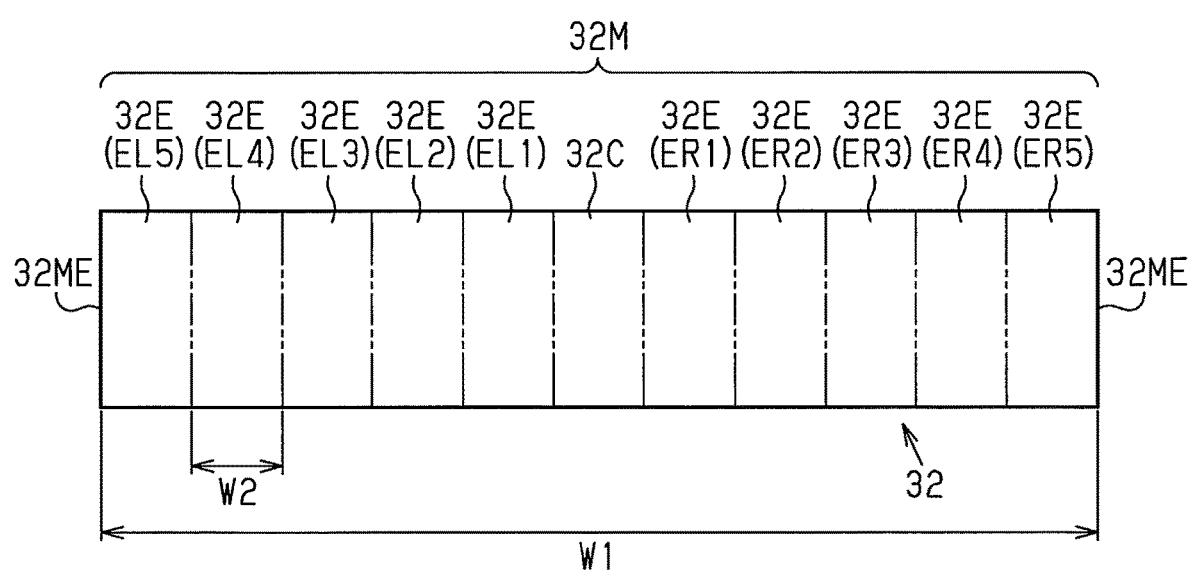
FIG. 2 is a plan view showing the planar structure of the mask member according to the embodiment.

As shown in FIG. 2, the mask member 32 includes a mask region 32M. The mask region 32M includes mask holes. The mask region 32M consists of a central region 32C and end regions 32E arranged in a direction in which the mask holes are arranged. The central region 32C includes the center of the mask region 32M and includes the mask holes for facing a vapor deposition source. Each end region 32E is located closer to one of ends 32ME of the mask region 32M than the central region 32C and includes mask holes different from the mask holes included in the central region 32C. The outer circumferential portion, that is, the rim portion of the mask region 32M is rectangular. The position in the middle of the pair of opposing sides of the mask region 32M is the center of the mask region 32M.

The central region 32C and the end regions 32E of the mask region 32M are defined in a defining direction. In the mask region 32M, as the distance between the end region 32E and the central region 32C is increased in the defining direction, the end region 32E is located farther from the vapor deposition source. In other words, the greater the distance between the end region 32E and the central region 32C in the defining direction, the greater becomes the distance between the end region 32E and the vapor deposition source, that is, the distance in the defining direction.

In the mask region 32M, ten end regions 32E are defined. The central region 32C is located between the fifth end region 32E and the sixth end region 32E from each end 32ME of the mask region 32M.

Five of the ten end regions 32E located on the right side of the central region 32C in the defining direction on the sheet of the drawing are referred to as right end regions. The end regions 32E that are the right end regions are referred to as a first right region ER1, a second right region ER2, a third right region ER3, a fourth right region ER4, and a fifth right region ER5 in the order from the region close to the central region 32C.

Five of the ten end regions 32E located on the left side of the central region 32C in the defining direction on the sheet of the drawing are referred to as left end regions. The end regions 32E that are the left end regions are referred to as a first left region EL1, a second left region EL2, a third left region EL3, a fourth left region EL4, and a fifth left region EL5 in the order from the region close to the central region 32C.

The width of the mask region 32M in the defining direction is referred to as a first width W1, and the width of the central region 32C and each end region 32E in the defining direction is referred to as a second width W2. The second width W2 of the central region 32C and the second width W2 of each end region 32E are equal to each other. The central region 32C and the end regions 32E may include regions having different second widths W2.

All the mask holes included in the central region 32C, in other words, the entire central region 32C face the vapor deposition source of the vapor deposition apparatus. However, it is only required that at least some of the mask holes included in the central region 32C face the vapor deposition source.

The mask holes included in each end region 32E, in other words, each end region 32E includes at least one of the section facing the vapor deposition source and the section not facing the vapor deposition source. That is, one end region 32E may include only the mask holes facing the vapor deposition source, may include only the mask holes not facing the vapor deposition source, or may include both the mask holes facing the vapor deposition source and the mask holes not facing the vapor deposition source. An example of the planar structure of the mask member 32 will be described with reference to FIG. 3 illustrating a partially enlarged view of the planar structure.

Figure 3:
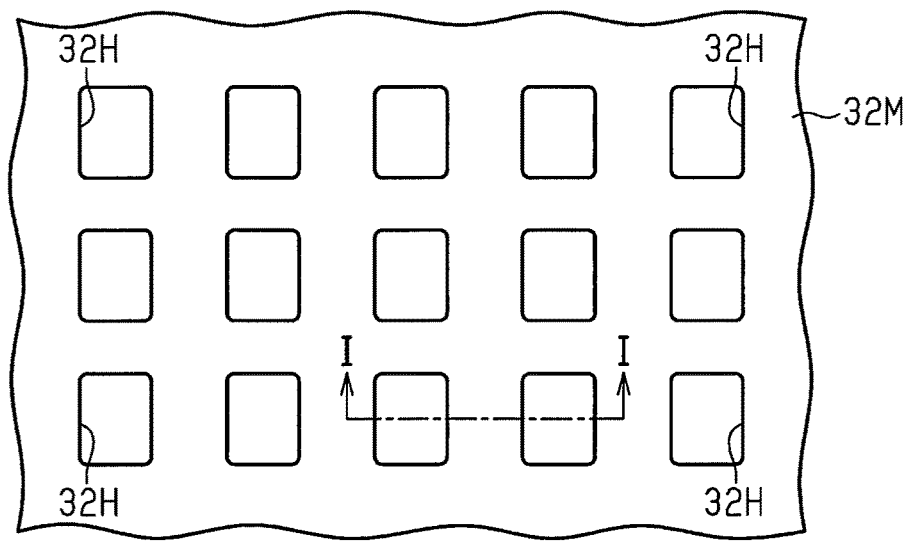
FIG. 3 is an enlarged partial plan view showing the planar structure of the mask member according to the embodiment.

As shown in FIG. 3, the mask region 32M includes mask holes 32H. The mask holes 32H are arranged at equal intervals in a first direction and are arranged at equal intervals in a second direction orthogonal to the first direction on the surface of the mask region 32M that is reverse from the surface facing the vapor deposition source and faces a vapor deposition target. That is, the mask holes are arranged in a grid pattern in the mask region 32M, and the mask member 32 has a grid pattern. The central region 32C and each end region 32E include the mask holes 32H arranged in a grid pattern. The mask holes 32H may be arranged in a staggered manner in the mask region 32M.

The mask member 32 is formed of a metal mask substrate. The metal mask substrate is a metal sheet mainly containing an alloy of iron and nickel. The metal mask substrate is preferably formed of an iron-nickel alloy containing 30 mass % or more and 45 mass % or less of nickel. Specifically, the metal mask substrate is more preferably formed mainly of an alloy containing 36 mass % of nickel and 64 mass % of iron, that is, invar. If the mask member 32 is formed of invar, the thermal expansion coefficient of the mask member 32 is about $1.2 \times 10^{-6}/°$ C., for example.

If the mask member 32 has such a thermal expansion coefficient, the degree of the thermal expansion of the mask member 32 matches with the degree of the thermal expansion of a glass substrate. Thus, the mask member 32 formed of invar is preferred in using the glass substrate as an example of the vapor deposition target.

An example of the cross-sectional structure of the central region 32C in the mask region 32M will be described with reference to FIG. 4, and an example of the cross-sectional structure of each end region 32E in the mask region 32M will be described with reference to FIGS. 5 and 6. In the following description, as an example of the cross-sectional structure of each end region 32E, an example of the cross-sectional structure of the first right region ER1 and an example of the cross-sectional structure of the fifth right region ER5 will be described. The description for the cross-sectional structure of other end regions 32E will be omitted.

Figure 4:
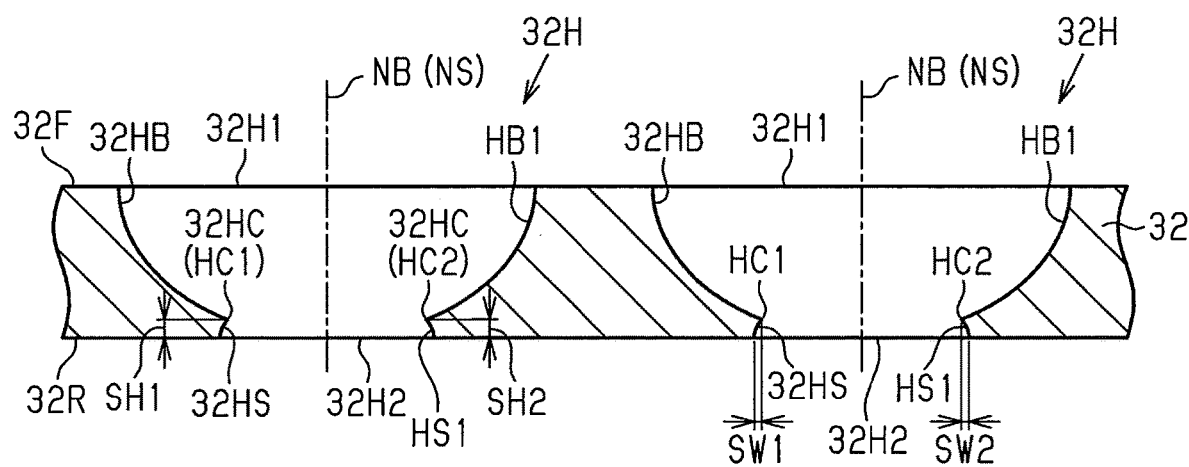
FIG. 4 is an enlarged partial cross-sectional view showing the cross-sectional structure of a central region according to the embodiment.
Figure 5:
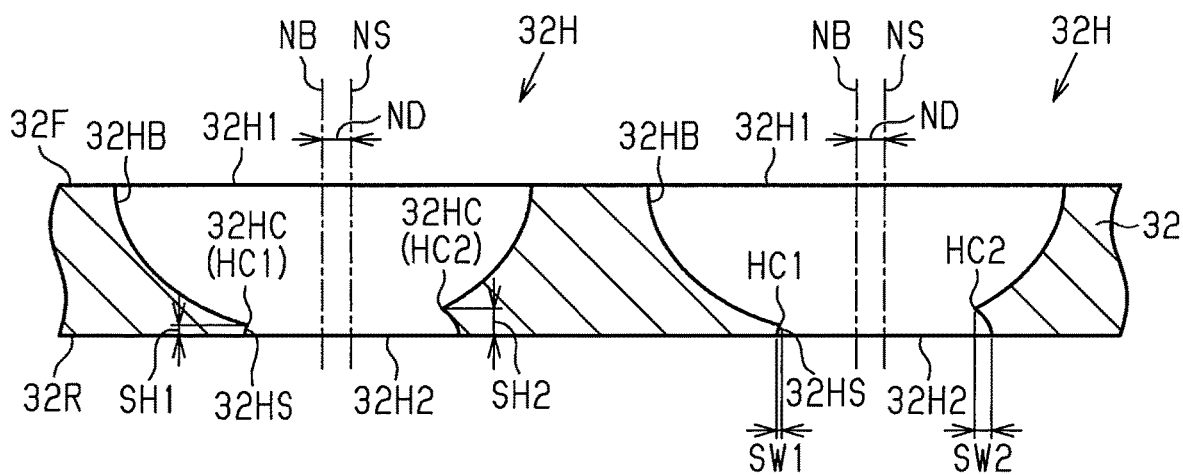
FIG. 5 is an enlarged partial cross-sectional view showing the cross-sectional structure of a first right region according to the embodiment.
Figure 6:
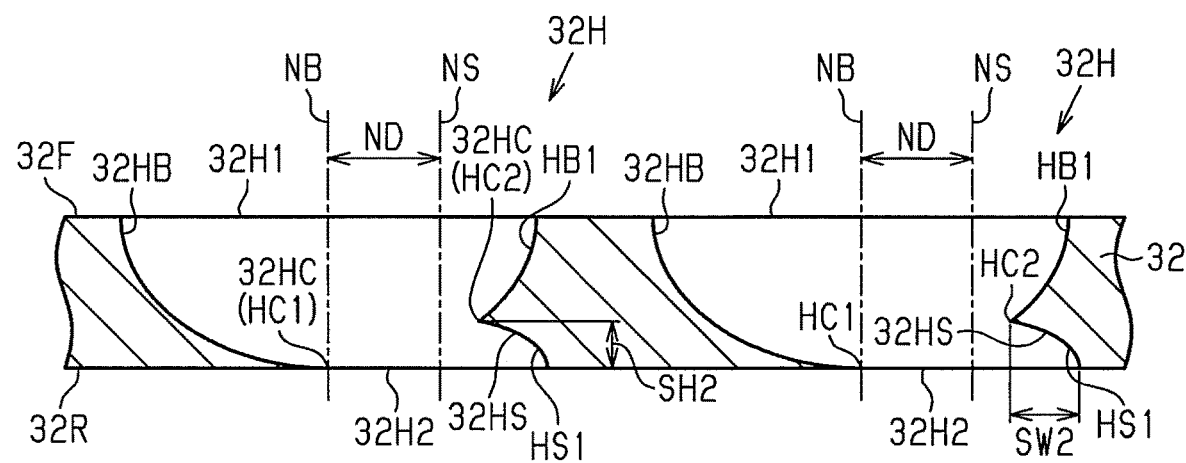
FIG. 6 is an enlarged partial cross-sectional view showing the cross-sectional structure of a fifth right region according to the embodiment.

The cross-sectional structures illustrated in FIGS. 4 to 6 are the cross-sectional structures taken along line I-I in FIG. 3, in other words, the cross-sectional structures along a line extending in the defining direction. However, the positions in the defining direction differ from each other.

As shown in FIG. 4, the mask region 32M includes an obverse surface 32F and a reverse surface 32R that is reverse from the obverse surface 32F. The obverse surface 32F includes large openings 32H1 of the mask holes 32H, and the reverse surface 32R includes small openings 32H2 of the mask holes 32H. In a plan view facing the obverse surface 32F, the region defined by each large opening 32H1 is greater than the region defined by each small opening 32H2.

Each mask hole 32H includes a large hole 32HB, a small hole 32HS, and a connection portion 32HC at which the large hole 32HB is connected to the small hole 32HS. The large hole 32HB includes the large opening 32H1 and narrows toward the small opening 32H2, and the small hole 32HS includes the small opening 32H2 and narrows toward the large opening 32H1.

More specifically, the large hole 32HB is shaped in such a manner that the cross-sectional area in a direction parallel to the obverse surface 32F monotonically decreases from the obverse surface 32F toward the reverse surface 32R and has an inner circumferential surface HB1 shaped like an arc in the cross section orthogonal to the obverse surface 32F. The small hole 32HS is shaped in such a manner that the cross-sectional area in a direction parallel to the obverse surface 32F monotonically decreases from the reverse surface 32R toward the obverse surface 32F and has an inner circumferential surface HS1 shaped like an arc in the cross section orthogonal to the obverse surface 32F.

That is, the size of the region defined by the large hole 32HB monotonically decreases from the obverse surface 32F toward the reverse surface 32R, and the size of the region defined by the small hole 32HS monotonically decreases from the reverse surface 32R toward the obverse surface 32F. Thus, the size of the region defined by the mask hole 32H is the smallest at the connection portion 32HC.

In the central region 32C, each connection portion 32HC protrudes inward of the corresponding mask hole 32H along the entire circumference of the mask hole 32H. Among the mask holes 32H included in the central region 32C, the connection portion 32HC of the mask holes 32H located at positions other than the center of the mask region 32M includes a first section HC1 and a second section HC2. The first section HC1 is the section closer to the center of the mask region 32M. The second section HC2 is the section closer to one of the ends of the mask region 32M.

The vapor deposition metal mask 30 may include the mask holes 32H that include the connection portion 32HC at the center of the mask region 32M. Like other connection portions 32HC, the connection portion 32HC located at the center of the mask region 32M also protrudes inward of the corresponding mask hole 32H along the entire circumference of the mask hole 32H.

In each mask hole 32H, the distance between the first section HC1 and the reverse surface 32R is referred to as a first step height SH1, and the distance between the second section HC2 and the reverse surface 32R is referred to as a second step height SH2. In each mask hole 32H located in the central region 32C, the first step height SH1 and the second step height SH2 are substantially the same. The first step height SH1 and the second step height SH2 in the central region 32C are preferably, for example, 3 µm or less.

In the cross section orthogonal to the obverse surface 32F, the protruding amount of the first section HC1, that is, the amount of the first section HC1 protruding inward of the small opening 32H2 is referred to as a first step width SW1. In the cross section orthogonal to the obverse surface 32F, the protruding amount of the second section HC2, that is, the amount of the second section HC2 protruding inward of the small opening 32H2 is referred to as a second step width SW2. In each mask hole 32H located in the central region 32C, the first step width SW1 and the second step width SW2 are substantially the same. The first step width SW1 and the second step width SW2 in the central region 32C are preferably, for example, 1.5 µm or more and 2.0 µm or less.

In the cross section orthogonal to the obverse surface 32F, a normal to the obverse surface 32F passing through the center of the large opening 32H1 is referred to as a large hole normal NB, and a normal to the obverse surface 32F passing through the center of the small opening 32H2 is referred to as a small hole normal NS. In each mask hole 32H included in the central region 32C, the position of the large hole normal NB and the position of the small hole normal NS that belong to the same mask hole 32H are substantially the same. That is, when the distance between the large hole normal NB and the small hole normal NS of one mask hole 32H in a direction in which the mask holes 32H are arranged is referred to as a normal-to-normal distance ND, the normal-to-normal distance ND in the central region 32C is zero.

As shown in FIG. 5, like the mask holes 32H included in the central region 32C, each mask hole 32H included in the first right region ER1 includes the large hole 32HB, the small hole 32HS, and the connection portion 32HC. The large hole 32HB narrows toward the small opening 32H2, and the small hole 32HS narrows toward the large opening 32H1.

Like the mask holes 32H included in the central region 32C, the connection portion 32HC protrudes inward of the corresponding mask hole 32H along the entire circumference of the mask hole 32H and includes the first section HC1 and the second section HC2. In the first right region ER1, the second step height SH2 is greater than the first step height SH1.

The first step height SH1 in the first right region ER1 is smaller than the first step height SH1 in the central region 32C. The second step height SH2 in the first right region ER1 is greater than the second step height SH2 in the central region 32C.

The first step width SW1 in the first right region ER1 is smaller than the first step width SW1 in the central region 32C. The second step width SW2 in the first right region ER1 is greater than the second step width SW2 in the central region 32C.

In the cross section orthogonal to the obverse surface 32F, the large hole normal NB that belongs to each mask hole 32H is located closer to the center than the small hole normal NS that belongs to the same mask hole 32H. The normal-to-normal distance ND in the first right region ER1 is greater than the normal-to-normal distance ND in the central region 32C.

As shown in FIG. 6, like the mask holes 32H included in the central region 32C, each mask hole 32H included in the fifth right region ER5 includes the large hole 32HB, the small hole 32HS, and the connection portion 32HC. The large hole 32HB narrows toward the small opening 32H2, and the small hole 32HS narrows toward the large opening 32H1.

Like the mask holes 32H included in the central region 32C, the connection portion 32HC protrudes inward of the corresponding mask hole 32H along the entire circumference of the mask hole 32H and includes the first section HC1 and the second section HC2. In the fifth right region ER5, the first step height SH1 is zero, and the second step height SH2 is greater than the first step height SH1.

The first step height SH1 in the fifth right region ER5 is less than the first step height SH1 in the central region 32C and is less than the first step height SH1 in the first right region ER1. In contrast, the second step height SH2 in the fifth right region ER5 is greater than the second step height SH2 in the central region 32C and is greater than the second step height SH2 in the first right region ER1.

The first step width SW1 in the fifth right region ER5 is zero, is less than the first step width SW1 in the central region 32C, and is less than the first step width SW1 in the first right region ER1. In contrast, the second step width SW2 in the fifth right region ER5 is greater than the second step width SW2 in the central region 32C and is greater than the second step width SW2 in the first right region ER1.

In the cross section orthogonal to the obverse surface 32F, the large hole normal NB that belongs to each mask hole 32H is located closer to the center than the small hole normal NS that belongs to the same mask hole 32H. The normal-to-normal distance ND is greater than the normal-to-normal distance ND in the central region 32C and the normal-to-normal distance ND in the first right region ER1.

As described above, the large hole 32HB narrows toward the small opening 32H2, and the small hole 32HS narrows toward the large opening 32H1. Additionally, the inner circumferential surface HB1 of the large hole 32HB and the inner circumferential surface HS1 of the small hole 32HS both have an arcuate shape. It is therefore possible to change the size of the first step height SH1 and the size of the second step height SH2 in each mask hole 32H by changing the distance between the small hole normal NS of the small hole 32HS specific to one mask hole 32H and the large hole normal NB of the large hole 32HB specific to the same mask hole 32H.

Furthermore, in the mask hole 32H in which the large hole normal NB does not coincide with the small hole normal NS, one of the first step height SH1 and the second step height SH2 closer to the large hole normal NB is made smaller than the size in the mask hole 32H in which the large hole normal NB coincides with the small hole normal NS. In contrast, in the mask hole 32H in which the large hole normal NB does not coincide with the small hole normal NS, one of the first step height SH1 and the second step height SH2 farther from the large hole normal NB is made greater than the size in the mask hole 32H in which the large hole normal NB coincides with the small hole normal NS.

In the cross section orthogonal to the obverse surface 32F, if the normal-to-normal distance ND is in the range that does not exceed half the width of the small opening 32H2, the greater the normal-to-normal distance ND between the large hole normal NB and the small hole normal NS, the smaller becomes the step height closer to the large hole normal NB, and the greater becomes the step height farther from the large hole normal NB.

For this reason, the first step height SH1 of the mask hole 32H described with reference to FIG. 6 is smaller than the first step height SH1 of the mask hole 32H described with reference to FIG. 5. Furthermore, the second step height SH2 of the mask hole 32H described with reference to FIG. 6 is greater than the second step height SH2 of the mask hole 32H described with reference to FIG. 5.

In the above-described mask member 32, the first step height SH1 in the end regions 32E can be made smaller than the first step height SH1 in the central region 32C by only changing the position of the large holes 32HB with respect to the small holes 32HS. This facilitates designing of the vapor deposition metal mask 30.

With regard to the first step width SW1 and the second step width SW2 also, like the first step height SH1 and the second step height SH2, the greater the normal-to-normal distance ND, the smaller becomes the step width closer to the large hole normal NB and the greater becomes the step width farther from the large hole normal NB.

Although not shown, the shape of the mask holes 32H in the second right region ER2, the shape of the mask holes 32H in the third right region ER3, and the shape of the mask holes 32H in the fourth right region ER4 are substantially the same as the shape of the mask holes 32H in the central region 32C in that the mask holes 32H include the large hole, the small hole, and the connection portion.

However, the shape of the mask holes 32H in each right end region differs from the shape of the mask holes 32H in the central region 32C in the following respect. That is, the normal-to-normal distance ND in the second right region ER2, the normal-to-normal distance ND in the third right region ER3, and the normal-to-normal distance ND in the fourth right region ER4 are greater than the normal-to-normal distance ND in the central region 32C and are smaller than the normal-to-normal distance ND in the fifth right region ER5. In addition, the normal-to-normal distance ND in the second right region ER2, the normal-to-normal distance ND in the third right region ER3, and the normal-to-normal distance ND in the fourth right region ER4 increase in this order.

In other words, the vapor deposition metal mask 30 includes the end regions 32E arranged in a direction in which the mask holes 32H are arranged, and the greater the distance between the end region 32E and the central region 32C, the greater becomes the normal-to-normal distance ND in the end region 32E.

Thus, the first step height SH1 in the second right region ER2, the first step height SH1 in the third right region ER3, and the first step height SH1 in the fourth right region ER4 are smaller than the first step height SH1 in the central region 32C and are greater than the first step height SH1 in the fifth right region ER5. In addition, the first step height SH1 in the second right region ER2, the first step height SH1 in the third right region ER3, and the first step height SH1 in the fourth right region ER4 decrease in this order.

In other words, the vapor deposition metal mask 30 includes the end regions 32E arranged in a direction in which the mask holes 32H are arranged, and the greater the distance between the end region 32E and the central region 32C, the smaller becomes the first step height SH1 in the end region 32E.

Thus, as the distance between the end region 32E and the central region 32C is decreased, the first section HC1 of the mask holes 32H included in the end region 32E limits the passing of the vapor deposition material DM through the mask holes 32H to a greater extent than the first section HC1 of the mask holes 32H included in the end region 32E closer to the end 32ME of the mask region 32M than the above end region 32E. This improves the uniformity of the film thickness of the vapor deposition pattern formed in each mask hole 32H within the vapor deposition metal mask 30.

The second step height SH2 in the second right region ER2, the second step height SH2 in the third right region ER3, and the second step height SH2 in the fourth right region ER4 are greater than the second step height SH2 in the central region 32C and are smaller than the second step height SH2 in the fifth right region ER5. In addition, the second step height SH2 in the second right region ER2, the second step height SH2 in the third right region ER3, and the second step height SH2 in the fourth right region ER4 increase in this order.

In other words, in the end regions 32E of the vapor deposition metal mask 30, the greater the distance between the end region 32E and the central region 32C, the greater becomes the second step height SH2 in the end region 32E.

As described above, the greater the distance between the end region 32E and the central region 32C, the smaller becomes the first step height SH1 in the end region 32E. Thus, at the first section HC1 of the connection portion 32HC, the greater the distance between the end region 32E and the central region 32C, the lower becomes the strength of the first section HC1. In contrast, the greater the distance between the end region 32E and the central region 32C, the greater becomes the second step height SH2 in the end region 32E. Thus, at the second section HC2 of the connection portion 32HC, the greater the distance between the end region 32E and the central region 32C, the higher becomes the strength of the second section HC2. For this reason, in each end region 32E, the strength of the second section HC2 compensates for the decrease in the strength of the first section HC1.

Moreover, the second step height SH2 in each right end region is greater than the first step height SH1 in the same right end region. Thus, in the mask member 32, even if the first step height SH1 is decreased, the strength of the vapor deposition metal mask 30 is prevented from being decreased since the second step height SH2 is greater than or equal to the first step height SH1.

The first step width SW1 in the second right region ER2, the first step width SW1 in the third right region ER3, and the first step width SW1 in the fourth right region ER4 are smaller than the first step width SW1 in the central region 32C and are greater than the first step width SW1 in the fifth right region ER5. In addition, the first step width SW1 in the second right region ER2, the first step width SW1 in the third right region ER3, and the first step width SW1 in the fourth right region ER4 decrease in this order.

The second step width SW2 in the second right region ER2, the second step width SW2 in the third right region ER3, and the second step width SW2 in the fourth right region ER4 are greater than the second step width SW2 in the central region 32C and are smaller than the second step width SW2 in the fifth right region ER5. In addition, the second step width SW2 in the second right region ER2, the second step width SW2 in the third right region ER3, and the second step width SW2 in the fourth right region ER4 increase in this order.

When the normal to the obverse surface 32F of the mask member 32 passing through the center of the mask member 32 serves as the axis of symmetry, the above-described five left end regions are symmetrical with the five right end regions. For this reason, the detailed description of the left end regions will be omitted.

[Operation of Vapor Deposition Metal Mask]

Operation of the vapor deposition metal mask 30 will be described with reference to FIGS. 7 and 8. In FIG. 8, for purposes of illustration, only the mask member 32 of the vapor deposition metal mask 30 is illustrated, and the size of the mask holes 32H included in the mask member 32 is exaggerated. For example, the vapor deposition metal mask 30 is used for forming an organic layer constituting a light emitting element of an organic EL display.

Figure 7:
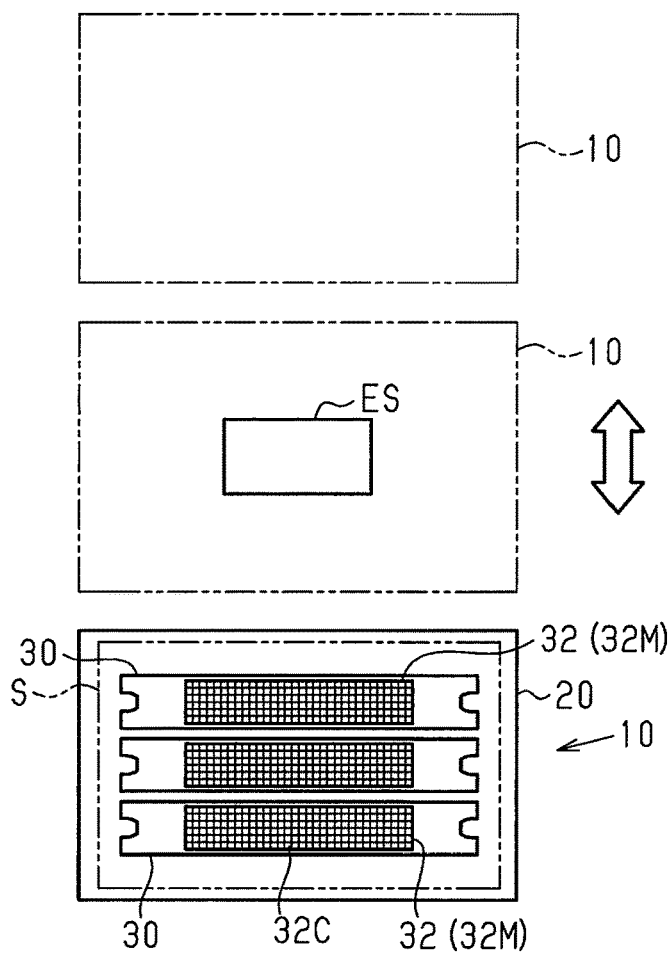
FIG. 7 is an operation diagram illustrating the operation of the vapor deposition metal mask.
Figure 8:
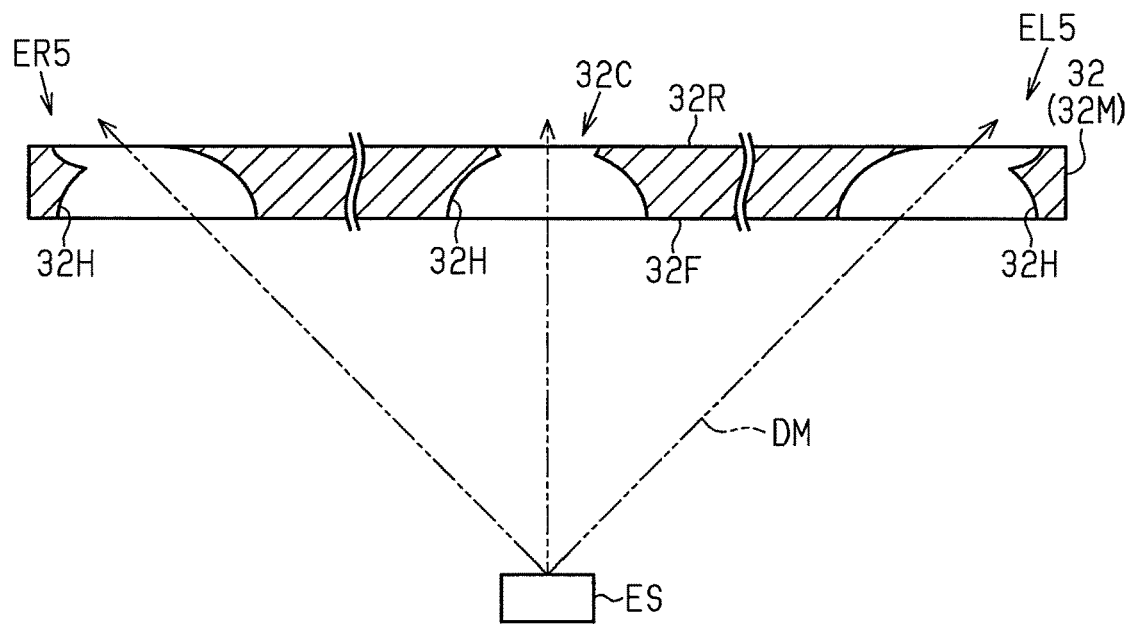
FIG. 8 is an operation diagram illustrating the operation of the vapor deposition metal mask.

As shown in FIG. 7, when film formation using the mask apparatus 10 is performed, first, the mask apparatus 10 is secured to the stage of the vapor deposition apparatus with the reverse surfaces 32R of the mask members 32 in contact with a vapor deposition target S. The vapor deposition apparatus includes a vapor deposition source ES, and the mask apparatus 10 is secured to the stage in such a manner that the mask holes included in the central regions 32C of the mask regions 32M face the vapor deposition source ES.

In the vapor deposition apparatus, while the position of the vapor deposition source ES of the vapor deposition apparatus is fixed, the position of the stage with respect to the vapor deposition source ES is changed. For example, the stage is movable along the straight line that passes through the center of the vapor deposition source ES and extends in a one-dimensional direction. This allows the mask holes 32H included in the central regions 32C of the mask members 32 to face the vapor deposition source ES.

When the vapor deposition source ES starts discharging the vapor deposition material, and subsequently the stage moves in the one-dimensional direction, the vapor deposition material that has passed through the mask holes 32H included in the mask members 32 reaches the vapor deposition target S moving in the one-dimensional direction. This forms the vapor deposition patterns on the vapor deposition target S.

Alternatively, the vapor deposition apparatus may be configured in such a manner that while the position of the stage in the vapor deposition apparatus is fixed, the position of the vapor deposition source ES with respect to the stage is varied. With this configuration, it is only required that the vapor deposition source ES is movable along the straight line that passes through the central regions 32C of the mask members 32 and extends in the one-dimensional direction.

As shown in FIG. 8, in a state in which the central region 32C of each mask member 32 faces the vapor deposition source ES, the traveling direction of the vapor deposition material DM that is discharged from the vapor deposition source ES and travels toward the mask holes 32H included in the central region 32C is a direction extending substantially in the direction of the normal to the obverse surface 32F of the mask member 32.

In contrast, in the traveling directions of the vapor deposition material DM that travels toward the positions closer to the ends 32ME of the mask region 32M than the central region 32C, the deviation from the direction of the normal is increased as the distance between the center of the mask region 32M and the position to which the vapor deposition material DM travels is increased. More specifically, the greater the distance between the center of the mask region 32M and the position to which the vapor deposition material DM travels, the greater becomes the angle between the traveling direction of the vapor deposition material DM and the direction of the normal.

The amount of the vapor deposition material DM discharged from the vapor deposition source ES is generally the greatest at the position facing the vapor deposition source ES and varies in the range in which the vapor deposition material DM is discharged. Moreover, the greater the angle between the direction of the normal and the traveling direction, the greater becomes the difference in the amount of the vapor deposition material DM between the mask holes facing the vapor deposition source ES and the other mask holes. It is therefore preferable to reduce the amount of the vapor deposition material DM that reaches the section of the vapor deposition target S facing the vapor deposition source ES in order to reduce the variation between the mask holes 32H in the film thickness of the vapor deposition pattern formed in each mask hole 32H.

In each mask hole 32H, since the small hole 32HS narrows toward the large opening 32H1, the protruding amount of the connection portion 32HC inward of the mask hole 32H is increased as the first step height SH1 and the second step height SH2 is increased. Thus, when the vapor deposition target is viewed from the vapor deposition material DM that travels toward the obverse surface 32F of the mask member 32, the unnecessary section masked by the mask member 32 is increased. In other words, the shadow effect of the mask member 32 is increased. As the shadow effect is increased, passing of the vapor deposition material DM through the mask holes 32H is limited more by the connection portion 32HC.

Thus, according to the mask member 32 of each vapor deposition metal mask 30, the first section HC1 of the mask holes 32H included in the central region 32C limits the passing of the vapor deposition material DM to a greater extent than the first section HC1 of the mask holes 32H included in the end regions 32E. This improves the uniformity of the film thickness of the vapor deposition pattern formed in each mask hole 32H in the vapor deposition metal mask 30.

In other words, in order to reduce the variation between the mask holes 32H in the film thickness of the vapor deposition pattern formed in each mask hole 32H, it is preferable to allow the vapor deposition material DM traveling toward the mask holes 32H to pass through the mask holes 32H in a traveling direction with as small deviation as possible from the direction of the normal.

According to the above-described mask member 32, the vapor deposition material DM that travels in a traveling direction with as small deviation as possible from the direction of the normal reaches the mask holes 32H included in the end regions 32E. This improves the uniformity of the film thickness of the vapor deposition pattern formed in each mask hole 32H in the vapor deposition metal mask 30.

When the vapor deposition metal mask 30 is used for forming an organic layer constituting a light emitting element as one example of the vapor deposition pattern, improving the uniformity of the film thickness of the organic layer in the vapor deposition metal mask 30 improves the uniformity of the amount of light emitted from multiple light emitting elements. As a result, the display quality of the display is improved.

In contrast, if the film thickness of the organic layer formed in each mask hole varies in the vapor deposition metal mask, the amount of light emitted from the light emitting elements varies in the display.

As described above, the method for manufacturing the display including the vapor deposition patterns formed using the vapor deposition metal masks 30 includes forming the vapor deposition metal masks 30 and forming the vapor deposition patterns on the vapor deposition target S using the vapor deposition metal masks 30.

[Method for Manufacturing Vapor Deposition Metal Mask]

The method for manufacturing the vapor deposition metal mask 30 will be described with reference to FIGS. 9 to 13. In the method for manufacturing the vapor deposition metal mask 30, a step of forming the mask member 32 will be described. For purposes of illustration, FIGS. 9 to 13 illustrate the step of forming one mask hole 32H in the section corresponding to the central region 32C and the step of forming one mask hole 32H in the section corresponding to the first right region ER1.

In the method for manufacturing the vapor deposition metal mask 30, the mask member 32 including the central region 32C and the end regions 32E is formed. The central region 32C includes, as described above, the center of the mask region 32M, which includes the mask holes 32H, and the mask holes 32H for facing the vapor deposition source. Each end region 32E includes, also as described above, the mask holes 32H that are located closer to one of the ends 32ME of the mask region 32M than the central region 32C and are different from the mask holes 32H included in the central region 32C.

Figure 9:
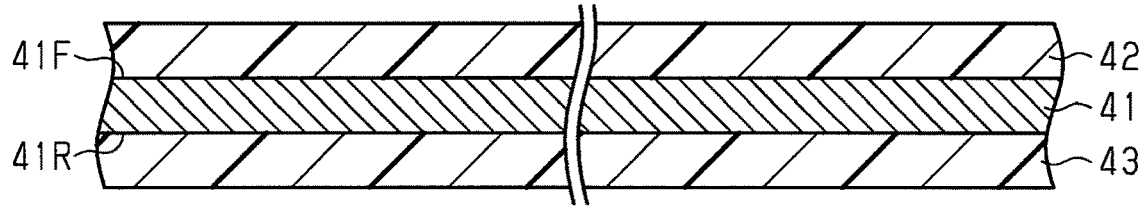
FIG. 9 is a diagram showing the step of placing resist layers on a metal mask substrate in a method for manufacturing the vapor deposition metal mask according to the embodiment.

As shown in FIG. 9, when the mask member 32 is formed, first, a metal mask substrate 41, which includes an obverse surface 41F and a reverse surface 41R, is prepared. The thickness of the metal mask substrate 41 is preferably, for example, 10 µm or more and 50 µm or less.

A first resist layer 42 is placed on the obverse surface 41F of the metal mask substrate 41, and a second resist layer 43 is placed on the reverse surface 41R of the metal mask substrate 41. The first resist layer 42 and the second resist layer 43 are formed of a negative resist, but may be formed of a positive resist.

The placement of the resist layer on each surface may be performed by adhering a dry film resist on each surface or by applying coating liquid including a resist material on each surface and drying the coating liquid to form the resist layer on each surface.

Figure 10:
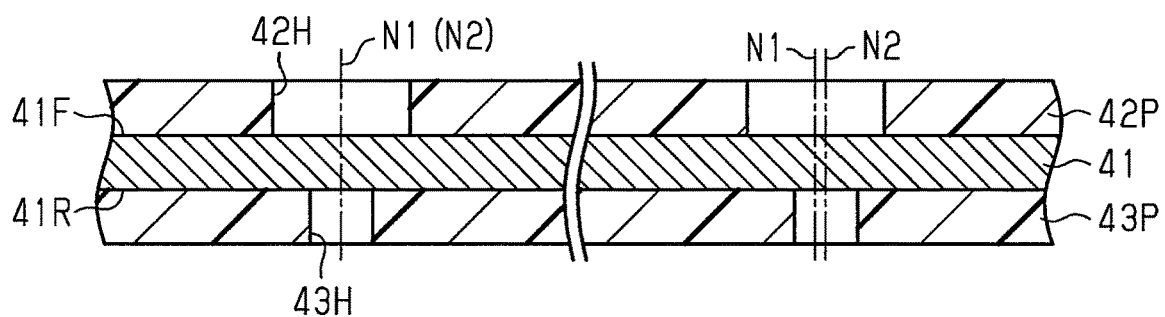
FIG. 10 is a diagram showing the step of forming a resist pattern according to the embodiment.

As shown in FIG. 10, sections of the resist layers other than the sections where the through-holes are to be formed are exposed to light, and the resist layers that have been exposed to light are developed to form a first through-hole 42H in the first resist layer 42 and a second through-hole 43H in the second resist layer 43. In other words, the first resist layer 42 is patterned to form a first resist pattern 42P, and the second resist layer 43 is patterned to form a second resist pattern 43P.

At this time, in the section of each resist layer where the mask holes 32H included in the central region 32C are to be formed, the resist layer is patterned as follows. That is, in a cross section orthogonal to the obverse surface 41F, each resist layer is patterned in such a manner that a first normal N1 coincides with a second normal N2. The first normal N1 is the normal to the obverse surface 41F and passes through the center of the opening of the first through-hole 42H. The second normal N2 is the normal to the obverse surface 41F and passes through the center of the opening of the second through-hole 43H.

In the section of each resist layer where the mask holes 32H included in the first right region ER1 are to be formed, each resist layer is patterned in such a manner that the first normal N1 is located closer to the center than the second normal N2 within the region of the metal mask substrate 41 corresponding to the mask member 32.

When each resist layer is exposed to light, an original plate is placed on the surface of each resist layer reverse to the surface in contact with the metal mask substrate 41. The original plate is configured to allow light to reach the section other than the section in which through-holes are to be formed. When each exposed resist layer is developed, for example, an aqueous sodium carbonate solution is used as a developer. If each resist layer is formed of a positive resist, the sections of each resist layer where the through-holes are to be formed are exposed to light.

Figure 11:
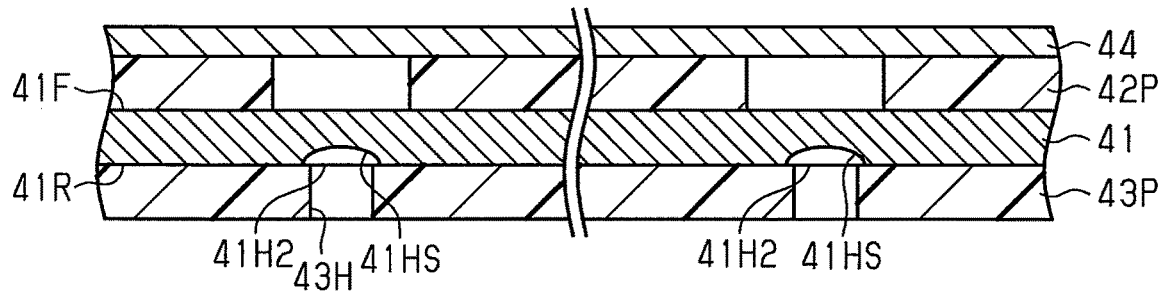
FIG. 11 is a diagram showing the step of forming small holes according to the embodiment.

As shown in FIG. 11, small holes 41HS are formed in the reverse surface 41R of the metal mask substrate 41 toward the obverse surface 41F. Each small hole 41HS includes a small opening 41H2 that is open in the reverse surface 41R, narrows toward the obverse surface 41F, and is specific to each mask hole 32H.

In the step of forming the small holes 41HS, the metal mask substrate 41 is etched from the reverse surface 41R toward the obverse surface 41F with, for example, a ferric chloride solution using the second resist pattern 43P as a mask. At this time, an obverse surface protection layer 44 is formed on the first resist pattern 42P to prevent the obverse surface 41F of the metal mask substrate 41 from being etched simultaneously with the reverse surface 41R. The obverse surface protection layer 44 may be formed of any material that resists being etched by the ferric chloride solution.

Figure 12:
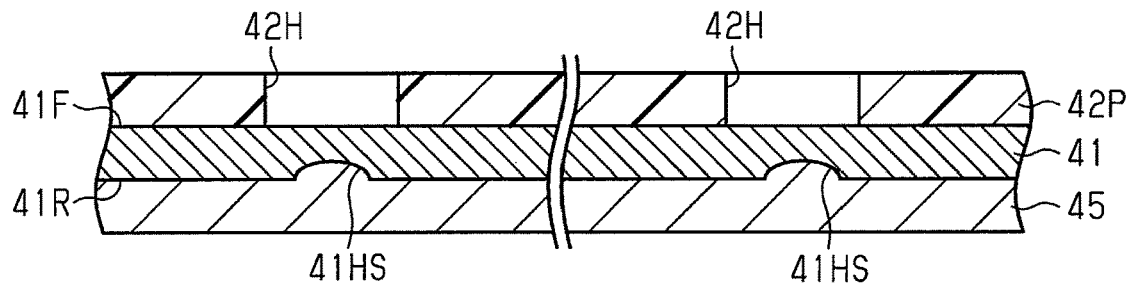
FIG. 12 is a diagram showing the step of forming a reverse surface protection layer according to the embodiment.

As shown in FIG. 12, the second resist pattern 43P, which is located on the reverse surface 41R of the metal mask substrate 41, and the obverse surface protection layer 44, which contacts the first resist pattern 42P, are removed. A reverse surface protection layer 45 for preventing the reverse surface 41R from being etched is formed on the reverse surface 41R of the metal mask substrate 41. The reverse surface protection layer 45 may be formed of any material that resists being etched by the ferric chloride solution.

Figure 13:
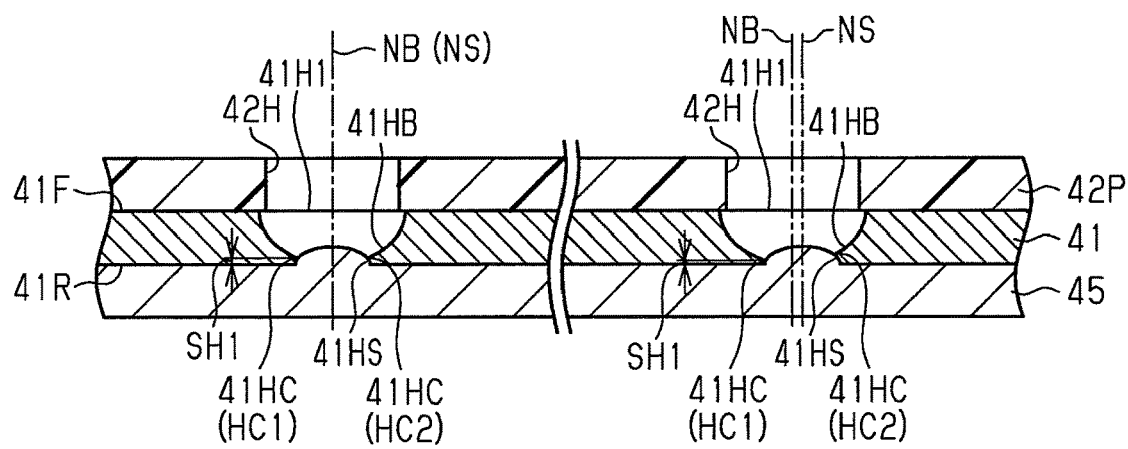
FIG. 13 is a diagram showing the step of forming large holes according to the embodiment.

As shown in FIG. 13, large holes 41HB are formed in the obverse surface 41F of the metal mask substrate 41 toward the reverse surface 41R. Each large hole 41HB includes a large opening 41H1 that is open in the obverse surface 41F, narrows toward the reverse surface 41R, and is specific to each mask hole 32H. This forms a connection portion 41HC at which each small hole 41HS is connected to the corresponding large hole 41HB. The small hole 41HS of the metal mask substrate 41 corresponds to the small hole 32HS of the mask member 32, and the large hole 41HB of the metal mask substrate 41 corresponds to the large hole 32HB of the mask member 32, and the connection portion 41HC of the metal mask substrate 41 corresponds to the connection portion 32HC of the mask member 32.

In forming the connection portions 41HC, the connection portions 41HC having the following shape are formed as the connection portions 41HC formed at positions other than the center of the mask region 32M. That is, each connection portion 41HC protrudes inward of the corresponding mask hole 32H along the entire circumference of the mask hole 32H and includes the first section HC1, which is the section closer to the center of the mask region 32M, and the second section HC2, which is the section closer to one of the ends 32ME of the mask region 32M.

The distance between the first section HC1 and the reverse surface 41R is referred to as the first step height SH1. In forming the connection portion 41HC, the connection portion 41HC in which the first step height SH1 is smaller than the first step height SH1 in the central region 32C is formed as the connection portion 41HC in the first right region ER1, which is one example of the end region 32E.

In the step of forming the connection portions 41HC, the obverse surface 41F of the metal mask substrate 41 is etched with, for example, a ferric chloride solution using the first resist pattern 42P as a mask. This forms the large holes 41HB recessed toward the reverse surface 41R in the obverse surface 41F of the metal mask substrate 41 through the first through-holes 42H of the first resist pattern 42P.

As described above, in each resist layer, the first normal N1 coincides with the second normal N2 in the section for forming the mask holes 32H included in the central region 32C. In the section for forming the mask holes 32H included in the first right region ER1, the first normal N1 is located closer to the center than the second normal N2 within the region corresponding to the mask member 32 in the metal mask substrate 41.

With regard to the large hole 41HB and the small hole 41HS specific to one mask hole 32H included in the central region 32C, the large hole 41HB is formed in such a manner that the large hole normal NB coincides with the small hole normal NS. The large hole normal NB of the large hole 41HB in the metal mask substrate 41 corresponds to the large hole normal NB of the large hole 32HB in the mask member 32, and the small hole normal NS of the small hole 41HS in the metal mask substrate 41 corresponds to the small hole normal NS of the small hole 32HS in the mask member 32.

With regard to the large hole 41HB and the small hole 41HS specific to one mask hole 32H included in the first right region ER1, the large hole 41HB is formed in such a manner that the large hole normal NB is located closer to the center than the small hole normal NS within the region of the metal mask substrate 41 corresponding to the mask member 32.

Thus, as the mask holes 32H included in the first right region ER1, the mask holes 32H in which the first step height SH1 is smaller than the first step height SH1 in the central region 32C are formed. Furthermore, as the mask holes 32H included in the first right region ER1, the mask holes 32H in which the normal-to-normal distance ND is substantially equal to the distance between the first normal N1 and the second normal N2 of the first resist pattern 42P are formed.

The reverse surface protection layer 45 and the first resist pattern 42P are then removed from the metal mask substrate 41 so that the mask member 32 of the above-described vapor deposition metal mask 30 is obtained.

In the section of the first resist pattern 42P for forming the mask holes included in the right end regions other than the first right region ER1, the distance between the first normal N1 of the first resist pattern 42P and the second normal N2 of the second resist pattern 43P may be set in accordance with the normal-to-normal distance ND in each right end region. In the section of the first resist pattern 42P for forming the mask holes included in the left end regions, the distance between the first normal N1 of the first resist pattern 42P and the second normal N2 of the second resist pattern 43P may be set in accordance with the normal-to-normal distance ND in each left end region.

EXAMPLES

Example 1

A metal mask substrate made of invar and having a thickness of 30 μm was prepared, and a mask member having a first width W1 of 440 mm and a second width W2 of 40 mm as described above was formed. Multiple mask holes were formed in the mask member. The width of the connection portion of each mask hole in the defining direction in which the end regions are defined was set to 40 μm, and the width in the direction orthogonal to the defining direction was set to 50 μm. Furthermore, the mask holes were arranged in a square grid pattern in the mask member, and the pitch at which the mask holes are located, that is, the pitch at which the small holes are located was set to 80 μm.

The following resist patterns were formed as the first resist pattern and the second resist pattern for forming the mask holes in the metal mask substrate. That is, as the second resist pattern, a resist pattern in which the second through-holes for forming the small holes were arranged at certain intervals was formed.

In contrast, as the first resist pattern, the first through-holes were formed in the section for forming the mask holes included in the central region and in the section for forming the mask holes included in the end regions in such a manner that the positions of the first through-holes with respect to the second through-holes in the central region differ from that in the end regions. More specifically, in the section for forming the mask holes included in the central region, the first through-holes were formed in such a manner that the above-described first normal and the second normal coincide with each other in the cross section orthogonal to the obverse surface of the metal mask substrate.

In the section for forming the mask holes included in each of the first right region and the first left region, the first through-holes were formed in such a manner that the distance between the first normal and the second normal is 1 μm. In the section for forming the mask holes included in each of the second right region and the second left region, the first through-holes were formed in such a manner that the distance between the first normal and the second normal is 2 μm.

In the section for forming the mask holes included in each of the third right region and the third left region, the first through-holes were formed in such a manner that the distance between the first normal and the second normal is 3 μm. In the section for forming the mask holes included in each of the fourth right region and the fourth left region, the first through-holes were formed in such a manner that the distance between the first normal and the second normal is 4 μm. In the section for forming the mask holes included in each of the fifth right region and the fifth left region, the first through-holes were formed in such a manner that the distance between the first normal and the second normal is 5 μm. This forms the mask holes having dimensions shown in the following Table 1 and Table 2 in each region.

TABLE 1

|  | Central Region | First Right Region | Second Right Region | Third Right Region | Fourth Right Region | Fifth Right Region |
|---|---|---|---|---|---|---|
| Normal-To-Normal Distance (μm) | 0 | 1 | 2 | 3 | 4 | 5 |
| First Step Height (μm) | 2.7 | 2.2 | 1.7 | 1.2 | 0.7 | 0.1 |
| Second Step Height (μm) | 2.7 | 3.0 | 3.3 | 3.5 | 3.8 | 4.0 |

TABLE 2

|  | Central Region | First Left Region | Second Left Region | Third Left Region | Fourth Left Region | Fifth Left Region |
|---|---|---|---|---|---|---|
| Normal-To-Normal Distance (μm) | 0 | 1 | 2 | 3 | 4 | 5 |
| First Step Height (μm) | 2.7 | 2.3 | 1.8 | 1.3 | 0.7 | 0.1 |
| Second Step Height (μm) | 2.7 | 2.9 | 3.3 | 3.6 | 3.8 | 4.0 |

As shown in Table 1, in the section of the central region excluding the center of the mask region, the mask holes having a normal-to-normal distance of 0 μm, a first step height of 2.7 μm, and a second step height of 2.7 μm were formed. In the first right region, the mask holes having a normal-to-normal distance of 1 μm, a first step height of 2.2 μm, and a second step height of 3.0 μm were formed.

In the second right region, the mask holes having a normal-to-normal distance of 2 μm, a first step height of 1.7 μm, and a second step height of 3.3 μm were formed. In the third right region, the mask holes having a normal-to-normal distance of 3 μm, a first step height of 1.2 μm, and a second step height of 3.5 μm were formed.

In the fourth right region, the mask holes having a normal-to-normal distance of 4 μm, a first step height of 0.7 μm, and a second step height of 3.8 μm were formed. In the fifth right region, the mask holes having a normal-to-normal distance of 5 μm, a first step height of 0.1 μm, and a second step height of 4.0 μm were formed.

As shown in Table 2, in the first left region, the mask holes having a normal-to-normal distance of 1 μm, a first step height of 2.3 μm, and a second step height of 2.9 μm were formed. In the second left region, the mask holes having a normal-to-normal distance of 2 μm, a first step height of 1.8 μm, and a second step height of 3.3 μm were formed.

In the third left region, the mask holes having a normal-to-normal distance of 3 μm, a first step height of 1.3 μm, and a second step height of 3.6 μm were formed. In the fourth left region, the mask holes having a normal-to-normal distance of 4 μm, a first step height of 0.7 μm, and a second step height of 3.8 μm were formed. In the fifth left region, the mask holes having a normal-to-normal distance of 5 μm, a first step height of 0.1 μm, and a second step height of 4.0 μm were formed.

That is, in the cross section orthogonal to the obverse surface of the mask member, as the distance between the end region and the center of the mask member was increased, the normal-to-normal distance was increased. This showed that as the distance between the end region and the center of the mask member was increased, the first step height was decreased.

After forming the vapor deposition metal mask by attaching such a mask member to the sub-frame, the vapor deposition metal mask was attached to the main frame to obtain the mask apparatus of Example 1.

Comparative Example 1

The mask apparatus of Comparative Example 1 was formed by the same method as Example 1 except that the first resist pattern was formed in such a manner that the first through-holes for forming the large holes are arranged at certain intervals, and the position of each large hole with respect to the corresponding one of the small holes connected to the large hole is constant. Thus, the mask member including the mask holes in which the normal-to-normal distance is zero was obtained as the mask member.

[Evaluation Result]

The mask apparatus of Example 1 was attached to the vapor deposition apparatus, and the vapor deposition patterns were formed under predetermined conditions. The mask apparatus of Comparative Example 1 was attached to the vapor deposition apparatus, and the vapor deposition patterns were formed under the same conditions as in Example 1.

Variation in the film thickness among the vapor deposition patterns was calculated in the vapor deposition patterns formed using the mask apparatus of Example 1 and the vapor deposition patterns formed using the mask apparatus of Comparative Example 1. The calculation showed that the variation in the film thickness of the vapor deposition patterns formed using the mask apparatus of Example 1 tends to be less than the variation in the film thickness of the vapor deposition patterns formed using the mask apparatus of Comparative Example 1.

As described above, the vapor deposition metal mask, the method for manufacturing the vapor deposition metal mask, and the method for manufacturing the display according to one embodiment have the following advantages.

(1) The first section HC1 of the mask holes 32H included in the central region 32C limits the passing of the vapor deposition material DM to a greater extent than the first section HC1 of the mask holes 32H included in the end regions 32E. This improves the uniformity of the film thickness of the vapor deposition pattern formed in each mask hole 32H within the vapor deposition metal mask 30.

(2) Even if the first step height SH1 is decreased, the strength of the vapor deposition metal mask 30 is prevented from being decreased since the second step height SH2 is greater than or equal to the first step height SH1.

(3) The first step height SH1 in the end regions 32E is set to be smaller than the first step height SH1 in the central region 32C by only changing the position of each large hole 32HB with respect to the corresponding small hole 32HS. This facilitates designing of the vapor deposition metal mask 30.

(4) The smaller the distance between the end region 32E and the central region 32C, the more the first section HC1 of the mask holes 32H included in the end region 32E limits passing of the vapor deposition material DM than the mask holes 32H included in the end region 32E located closer to one of the ends of the mask region 32M than that end region 32E. This improves the uniformity of the film thickness of the vapor deposition pattern formed in each mask hole 32H within the vapor deposition metal mask 30.

(5) The greater the distance between the end region 32E and the central region 32C, the greater becomes the second step height SH2 in the end region 32E. Thus, in each end region 32E, the strength of the second section HC2 compensates for the decrease in the strength of the first section HC1.

The above-described embodiments may be modified as follows.

In the fifth right region ER5 of the end regions 32E, the first step height SH1 in the region including one of the ends 32ME of the mask region 32M does not necessarily have to be zero. With this configuration also, as long as the first step height SH1 in each end region 32E is decreased as the distance between the end region 32E and the central region 32C is increased, the advantage equivalent to the above-described advantage (4) is obtained.

The first step height SH1 and the second step height SH2 in the central region 32C may be different from each other. With this configuration also, as long as the first step height SH1 in each end region 32E is decreased as the distance between the end region 32E and the central region 32C is increased, the advantage equivalent to the above-described advantage (4) is obtained. Furthermore, as long as the first step height SH1 in the end regions 32E is smaller than the first step height SH1 in the central region 32C, the advantage equivalent to the above-described advantage (1) is obtained.

Each of the first step width SW1 and the second step width SW2 in each region does not necessarily have to have the size exemplified in the above-described embodiment. It is only required that the sizes of the first step width SW1 and the second step width SW2 are determined in accordance with the sizes of the first step height SH1 and the second step height SH2 in each region.

In the mask region 32M, only the regions including the ends 32ME of the mask region 32M may be the end regions 32E. The mask region 32M may include regions each sandwiched between the central region 32C and one of the end regions 32E, that is, regions that are neither the central region 32C nor the end regions 32E. In this case, while the first step height SH1 in each end region 32E is smaller than the first step height SH1 in the central region 32C, the first step height SH1 in each region between the central region 32C and one of the end regions 32E does not necessarily have to be smaller than the first step height SH1 in the central region 32C.

This configuration has the following advantage.

(6) The advantage of decreasing the first step height SH1 in the end regions 32E to be smaller than the first step height SH1 in the central region 32C is easily obtained since the end regions 32E include the ends 32ME to which the vapor deposition material DM discharged from the vapor deposition source ES is the most difficult to reach within one mask region 32M.

The structure in which the mask region 32M includes multiple end regions 32E does not necessarily have to be configured in such a manner that as the distance between the end region 32E and the center of the mask region 32M is increased, the first step height SH1 is decreased. For example, the first step height SH1 may be increased as the distance between the end region 32E and the center of the mask region 32M is increased. Alternatively, the first step height SH1 in the end region 32E closer to the center of the mask region 32M may be smaller than the first step height SH1 in the end region 32E closer to one of the ends 32ME.

With this configuration also, as long as the first step height SH1 in each end region 32E is smaller than the first step height in the central region 32C, the advantage equivalent to the above-described advantage (1) is obtained.

The mask region 32M does not necessarily have to include ten end regions 32E. It is only required that the mask region 32M includes at least one end region 32E. Furthermore, in the mask region 32M, the number of the end regions 32E located on the right side of the central region 32C may differ from the number of the end regions 32E located on the left side of the central region 32C.

The normal-to-normal distance ND in each of the end regions 32E may be the same as one another. Alternatively, the normal-to-normal distance ND in each of the end regions 32E may be decreased as the distance from the center of the mask member 32 is increased. With this configuration also, as long as the first step height SH1 in each end region 32E is smaller than the first step height SH1 in the central region 32C, the advantage equivalent to the above-described advantage (1) is obtained.

As long as each large hole 32HB narrows toward the corresponding small opening 32H2, the inner circumferential surface HB1 of the large hole 32HB does not necessarily have to have an arcuate shape. As long as each small hole 32HS narrows toward the corresponding large opening 32H1, the inner circumferential surface HS1 of the small hole 32HS does not necessarily have to have an arcuate shape. In this case, both the inner circumferential surface HB1 of the large hole 32HB and the inner circumferential surface HS1 of the small hole 32HS may have a shape other than an arcuate shape, or either one may have a shape other than an arcuate shape.

In each end region 32E, the second step height SH2 and the first step height SH1 may be equal to each other. In the central region 32C and each end region 32E, the second step height SH2 may be smaller than the first step height SH1. With this configuration also, as long as the first step height SH1 in the end region 32E is smaller than the first step height SH1 in the central region 32C, the advantage equivalent to the above-described advantage (1) is obtained.

The metal mask substrate 41 and thus the mask member 32 may be formed of an alloy of iron and nickel and may include chromium as an additive. Alternatively, the metal mask substrate 41 and the mask member 32 may be formed of an alloy other than the alloy of iron and nickel or may be formed of metal.

The metal mask substrate 41 may be a metal sheet obtained by rolling of a base material or a metal sheet formed by electrolysis.

The metal mask substrate 41 for forming the mask member 32 may include a plastic layer in addition to a single metal layer. In this case, the metal layer and the plastic layer may be stacked one above the other. Alternatively, the metal mask substrate 41 may include two metal layers and a plastic layer. In this case, the plastic layer may be sandwiched between the two metal layers.

With this configuration also, it is only required that each mask hole includes the large hole that narrows toward the small opening, the small hole that narrows toward the large opening, and the connection portion at which the large hole is connected to the small hole, and the first step height in each end region is smaller than the first step height in the central region. With this configuration, the advantage equivalent to the above-described advantage (1) is obtained. In the metal mask substrate, the plastic layer is capable of being etched by, for example, exposure to a laser beam.

The mask member 32 may include, in addition to the mask region 32M, a region in which mask holes are not formed, that is, a no-mask region. For example, the mask member 32 may include the no-mask region on each of two ends in a direction in which the mask holes 32H are arranged.

In a configuration in which the vapor deposition apparatus includes multiple vapor deposition sources ES and one vapor deposition metal mask 30 faces the multiple vapor deposition sources ES, one mask member 32 may include multiple mask regions 32M. With this configuration, it is only required that each mask region 32M includes the central region 32C and the end regions 32E. As long as the first step height SH1 in the end regions 32E of each mask region 32M is smaller than the first step height SH1 in the central region 32C, the advantage equivalent to the above-described advantage (1) is obtained in each mask region 32M.

In a configuration in which one vapor deposition metal mask 30 includes multiple mask regions 32M also, each mask region 32M may include multiple end regions 32E, or each mask region 32M may include the end regions 32E as the regions including the ends 32ME of each mask region 32M.

One mask region 32M may be configured by all the mask holes of the vapor deposition metal mask, and the end regions 32E and the central region 32C may have the following configuration. That is, each end region 32E includes one of the ends 32ME of the mask region 32M and multiple mask holes 32H. The central region 32C is located closer to the center of the mask region 32M than the end regions 32E and includes multiple mask holes 32H that are different from the mask holes 32H included in the end regions 32E and are for facing the vapor deposition source ES.

With this configuration, if the vapor deposition apparatus includes only one vapor deposition source ES, the vapor deposition metal mask 30 faces only one vapor deposition source ES. In contrast, if the vapor deposition apparatus includes multiple vapor deposition sources ES, the vapor deposition metal mask 30 may be placed on the vapor deposition apparatus to face the multiple vapor deposition sources ES. When the vapor deposition metal mask 30 faces only one vapor deposition source ES, the mask region 32M includes one central region 32C. When the vapor deposition metal mask 30 faces multiple vapor deposition sources ES, the mask region 32M includes multiple central regions 32C.

In either case, as long as the first step height SH1 in each end region 32E is smaller than the first step height SH1 in the central region 32C, the following advantage is obtained.

(7) Regardless of whether one vapor deposition source ES faces the mask region 32M or multiple vapor deposition sources ES face the mask region 32M, the first step height SH1 in each end region 32E including one of the ends 32ME of the mask region 32M is smaller than the first step height SH1 in the central region 32C. Thus, the first section HC1 of the mask hole 32H included in the central region 32C limits the passing of the vapor deposition material DM to a greater extent than the first section HC1 of the mask hole 32H included in each end region 32E. This improves the uniformity of the film thickness of the vapor deposition pattern formed in each mask hole 32H in the vapor deposition metal mask 30.

One vapor deposition metal mask 30 may include multiple mask members 32. With this configuration, it is only required that the sub-frame 31 has the sub-frame holes 30H the number of which is equal to the number of the mask members 32. At this time, if the vapor deposition apparatus includes one vapor deposition source, the multiple mask members 32 configure one mask region 32M. If the vapor deposition apparatus includes multiple vapor deposition sources, and the vapor deposition metal mask includes one mask region 32M for the multiple vapor deposition sources, the multiple mask members 32 configure one mask region 32M.

In contrast, if the vapor deposition apparatus includes multiple vapor deposition sources and the vapor deposition metal mask includes one mask region for each vapor deposition source, each mask member 32 may configure one mask region or each mask member 32 may configure multiple mask regions. Alternatively, one mask region 32M may extend over multiple mask members 32.

Figure 14:
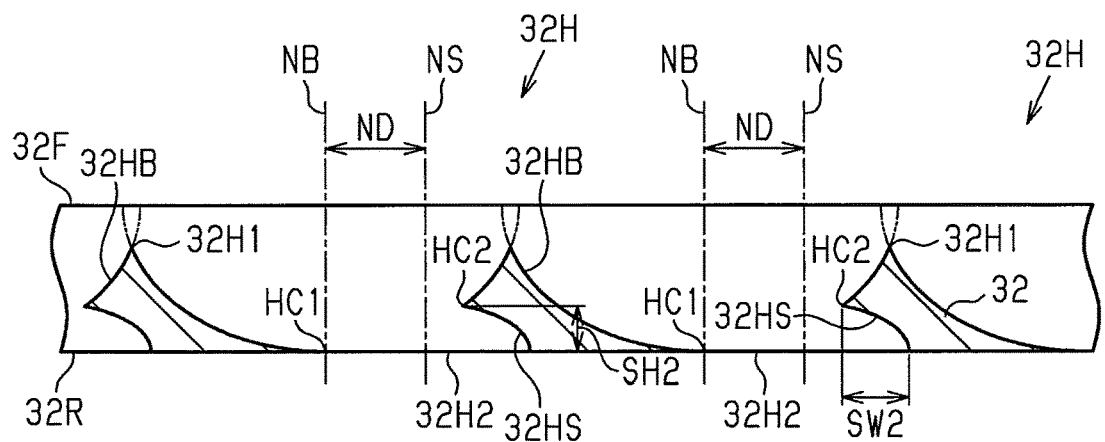
FIG. 14 is an enlarged partial cross-sectional view showing the cross-sectional structure of a fifth right region according to a modification.

As shown in FIG. 14, the large hole 32HB of each mask hole 32H and the large hole 32HB of the mask hole 32H that is adjacent in the direction in which the mask holes 32H are arranged may be connected to each other at the large openings 32H1. With this configuration also, it is only required that each mask hole 32H includes the large hole 32HB, which narrows toward the small opening 32H2, the small hole 32HS, which narrows toward the large opening 32H1, and the connection portion 32HC at which the large hole 32HB is connected to the small hole 32HS, and the first step height SH1 in each end region 32E is smaller than the first step height SH1 in the central region 32C. With this configuration, the advantage equivalent to the above-described advantage (1) is obtained.

FIG. 14 shows the cross-sectional structure of the fifth right region ER5 of the mask region 32M. In other regions of the mask region 32M, that is, in the central region 32C and other end regions 32E also, the adjacent large holes 32HB may be connected at the large openings 32H1 like in the fifth right region ER5.

The invention claimed is:

1. A vapor deposition metal mask comprising a mask region including a plurality of mask holes, wherein
the mask region includes a central region and an end region,
the central region includes a center of the mask region and some of the mask holes for facing a vapor deposition source,
the end region is located closer to one of ends of the mask region than the central region and includes some of the mask holes that are different from the mask holes included in the central region,
the mask region includes
an obverse surface including a large opening of each mask hole, and
a reverse surface including a small opening of each mask hole,
each mask hole includes
a large hole, which includes the large opening and narrows toward the small opening,
a small hole, which includes the small opening and narrows toward the large opening, and
a connection portion at which the large hole is connected to the small hole,
each connection portion located at the central region has a shape protruding inward of the mask hole along the entire circumference of the mask hole and is configured by a section, a distance between the section and the reverse surface is a step height for the central region;
each connection portion located at the end region has a shape protruding inward of the mask hole along the entire circumference of the mask hole and is configured by a first section, which is a section closer to the center of the mask region and a second section, which is a section closer to the one end of the mask region,
a distance between the first section and the reverse surface is a first step height for the end region, and
the first step height for the end region is smaller than the step height for the central region.

2. The vapor deposition metal mask according to claim 1, wherein
a distance between the second section and the reverse surface is a second step height, and
the second step height for each of the mask hole is greater than or equal to the step height for the central region.

3. The vapor deposition metal mask according to claim 1, wherein
the large hole includes an inner circumferential surface that has an arcuate shape in a cross section orthogonal to the obverse surface, the small hole includes an inner circumferential surface that has an arcuate shape in the cross section, among normals to the obverse surface in the cross section, a normal passing through a center of the large opening is a large hole normal, and a normal passing through a center of the small opening is a small hole normal, the large hole normal that belongs to each mask hole is located at a position that is the same as the small hole normal that belongs to the same mask hole or a position closer to the center of the mask region than the small hole normal that belongs to the same mask hole, the distance between the large hole normal and the small hole normal that belong to the same mask hole is a normal-to-normal distance, and the normal-to-normal distance in the end region is greater than the normal-to-normal distance in the central region.

4. The vapor deposition metal mask according to claim 3, wherein the end region is one of a plurality of end regions, the end regions are arranged in a direction in which the mask holes are arranged, and the greater the distance between the end region and the central region, the greater the normal-to-normal distance in the end region becomes.

5. The vapor deposition metal mask according to claim 1, wherein the end region is one of a plurality of end regions, the end regions are arranged in a direction in which the mask holes are arranged, and the greater the distance between the end region and the central region, the smaller the first step height in the end region becomes.

6. The vapor deposition metal mask according to claim 5, wherein the distance between the second section and the reverse surface is a second step height, and the greater the distance between the end region and the central region, the greater the second step height in the end region becomes.

7. The vapor deposition metal mask according to claim 1, wherein the end region is a region including one of the ends of the mask region.

8. A vapor deposition metal mask comprising a mask region configured by a plurality of mask holes included in the vapor deposition metal mask, wherein the mask region includes a central region and an end region, the end region includes some of the mask holes, the central region is located closer to a center of the mask region than the end region and includes some of the mask holes that are different from the mask holes included in the end region and are for facing a vapor deposition source, the mask region includes
an obverse surface including a large opening of each mask hole, and
a reverse surface including a small opening of each mask hole, each mask hole includes
a large hole, which includes the large opening and narrows toward the small opening,
a small hole, which includes the small opening and narrows toward the large opening, and
a connection portion at which the large hole is connected to the small hole, each connection portion located at the central region has a shape protruding inward of the mask hole along the entire circumference of the mask hole and is configured by a section, a distance between the section and the reverse surface is a step height for the central region;

each connection portion located at the end region has a shape protruding inward of the mask hole along the entire circumference of the mask hole and is configured by a first section, which is a section closer to the center of the mask region and a second section, which is a section closer to one of the ends of the mask region, a distance between the first section and the reverse surface is a first step height for the end region, and the first step height for the end region is smaller than the step height for the central region.

9. The vapor deposition metal mask according to claim 8, wherein a distance between the second section and the reverse surface is a second step height, and the second step height for each of the mask hole is greater than or equal to the step height for the central region.

10. The vapor deposition metal mask according to claim 8, wherein the large hole includes an inner circumferential surface that has an arcuate shape in a cross section orthogonal to the obverse surface, the small hole includes an inner circumferential surface that has an arcuate shape in the cross section, among normals to the obverse surface in the cross section, a normal passing through a center of the large opening is a large hole normal, and a normal passing through a center of the small opening is a small hole normal, the large hole normal that belongs to each mask hole is located at a position that is the same as the small hole normal that belongs to the same mask hole or a position closer to the center of the mask region than the small hole normal that belongs to the same mask hole, the distance between the large hole normal and the small hole normal that belong to the same mask hole is a normal-to-normal distance, and the normal-to-normal distance in the end region is greater than the normal-to-normal distance in the central region.

11. The vapor deposition metal mask according to claim 10, wherein the end region is one of a plurality of end regions, the end regions are arranged in a direction in which the mask holes are arranged, and the greater the distance between the end region and the central region, the greater the normal-to-normal distance in the end region becomes.

12. The vapor deposition metal mask according to claim 8, wherein the end region is one of a plurality of end regions, the end regions are arranged in a direction in which the mask holes are arranged, and the greater the distance between the end region and the central region, the smaller the first step height in the end region becomes.

13. The vapor deposition metal mask according to claim 12, wherein the distance between the second section and the reverse surface is a second step height, and the greater the distance between the end region and the central region, the greater the second step height in the end region becomes.

14. A vapor deposition metal mask comprising:

a mask region including a plurality of mask holes, each of the mask holes having a larger opening on an obverse surface than an opening on a reverse surface, the mask region includes a central region having some of the mask holes for facing a vapor deposition source; and each of the mask holes comprises a connection portion located within the hole and between the opening of the obverse surface and the opening of the reverse surface, wherein each of the connection portions, for mask holes located at an area of the central region, has a shape protruding inward of the mask hole along the entire circumference of the mask hole, the protruding shape having a first segment such that a distance between the first segment and the reverse surface is defined as a first step height;

each of the connection portions, for a set of mask holes located at an area between the central region and an end of the mask, has a shape including a second segment protruding inward of the mask hole, such that a distance between the second segment and the reverse surface is defined as a second step height; and the second step height is larger than the first step height.

15. The vapor deposition mask according to claim 14, wherein each of the connection portions for the set of mask holes located at the area between the central region and the end of the mask additionally comprises a third segment protruding inward of the mask hole, such that a distance between the third segment and the reverse surface is defined as a third step height; wherein the third step height is closer to the first step height than the second step height is to the first step height, and the third step height is smaller than the first step height.

16. The vapor deposition mask according to claim 15, wherein the set of mask holes comprises a plurality of sets of mask holes, extending in a direction from the central region to the end of the mask, such that for the plurality of the set of mask holes, the third step height decreases along the direction from the central region towards the end of the mask region.

17. The vapor deposition mask according to claim 16, wherein for the plurality of the sets of mask holes, the second step height increases along the direction from the central region towards the end of the mask.

18. The vapor deposition mask according to claim 14, wherein the set of mask holes comprises a plurality of sets of mask holes, extending in the direction from the central region to the end of the mask, such that for the plurality of the set of mask holes, the second step height increases along the direction from the central region towards the end of the mask.

* * * * *